(12) United States Patent
Tseng et al.

(10) Patent No.: US 8,467,477 B2
(45) Date of Patent: Jun. 18, 2013

(54) DECODING SYSTEM FOR LDPC CODE CONCATENATED WITH 4QAM-NR CODE

(75) Inventors: Chun-Chieh Tseng, Gueishan Township, Taoyuan County (TW); Chi-Nong Hsieh, Pitou Township, Changhua County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 741 days.

(21) Appl. No.: 12/585,805

(22) Filed: Sep. 25, 2009

(65) Prior Publication Data

US 2010/0074319 A1    Mar. 25, 2010

(30) Foreign Application Priority Data

Sep. 25, 2008   (TW) .............................. 97136822 A

(51) Int. Cl.
*H03D 1/04* (2006.01)
*H04L 27/06* (2006.01)

(52) U.S. Cl.
USPC ............ 375/316; 375/346; 375/343; 375/350

(58) Field of Classification Search
USPC ............... 375/219, 229–236, 240.24, 240.26, 375/240.27, 240.29, 265, 267, 278, 283, 375/284, 295, 296, 316, 350, 347, 346, 343, 375/340, 341, 324
See application file for complete search history.

(56) References Cited

U.S. PATENT DOCUMENTS

| 2007/0113162 | A1* | 5/2007 | Lery | .............................. 714/800 |
| 2007/0260959 | A1 | 11/2007 | Sidi et al. | |
| 2008/0137720 | A1* | 6/2008 | Waters et al. | .................. 375/230 |

* cited by examiner

*Primary Examiner* — Sam K Ahn
*Assistant Examiner* — Linda Wong
(74) *Attorney, Agent, or Firm* — Bacon & Thomas, PLLC

(57) ABSTRACT

A decoding system for LDPC code concatenated with 4QAM-NR code in a DTMB system is a two-stage decoding system. An NR decoder performs a 4QAM-NR decoding to obtain hard decision information. Then, the so obtained hard decision information together with corresponding soft symbol and channel state information are sent to a log-likelihood ratio (LLR) device for further computing a log-likelihood ratio after an adder adds a correction term associated with the hard decision information to a computed log-likelihood ratio without the hard decision information. An LDPC decoder receives the LLR for decoding.

10 Claims, 8 Drawing Sheets

DECODING SYSTEM FOR LDPC CODE CONCATENATED WITH 4QAM-NR CODE

BACKGROUND OF THE INVENTION

1. Field of the Invention

The present invention relates to the technical field of wireless transmission and, more particularly, to a decoding system of cascaded Low-density Parity-check code (LDPC code) concatenated with 4 Quadrature Amplitude Modulation Nordstrom-Robinson code (4QAM-NR code).

2. Description of Related Art

Low-density parity-check codes (LDPC codes) are known to have a high coding gain in performance and can be easily designed to approach Shannon bound. Also, encoding and/or decoding can be carried out easily thanks to its essential properties of sparse and regular structure in generating and parity check matrices. Hence, the LDPC codes have been widely used in wireless communication systems nowadays.

When LDPC codes are to be decoded, the log-likelihood ratio (LLR) corresponding to each coded bit in a codeword is required to be calculated for better decoding performance. Here, a cascaded coding scheme is considered where the LDPC code serves as an outer code and the decoding information provided by an inner code are sent to find the needed LLR for LDPC decoding. In such a scenario, computation of LLR becomes complicated. US Patent Publication No. 2007/0260959 discloses employing piecewise linear approximation skill to simplify LLR calculation, it does not consider code concatenation.

To demonstrate how a cascaded LDPC code works, a configuration of a digital television/terrestrial multimedia broadcast (DTMB) system 100 including LDPC code operated at 4QAM-NR modulation is illustrated as shown in FIG. 1. FIG. 2 depicts operation of the Nordstrom Robinson (NR) encoder 110 appearing in FIG. 1. As shown in FIGS. 1 and 2, the NR encoder 110 maps successive 8 information bits into 16 coded bits, where $a_0 \sim a_7$ denote information bits sent into NR encoder 110, and $a_0 \ldots a_7 b_0 \ldots b_7$ denote coded bit sequence out of NR encoder 110. As NR code is systematic, the coded bits out of NR encoder 110 include information bits ($a_0 \ldots a_7$) and redundant bits ($b_0 \ldots b$). The mapping between ($a_0 \ldots a_7$) and ($b_0 \ldots b_7$) is detailed in DTMB design specification.

FIG. 3 shows operation of the 4-quadrature amplitude modulation (4QAM) mapper 120. The 4QAM mapper 120 maps 16 coded bits into 8 4QAM symbols. The LLR computation device 130 computes LLRs for the LDPC decoding. In IEEE paper "Simplified Soft-Output Demapper for Binary Interleaved COFDM with Application to HIPERLAN/2" proposed by Filippo T. and Paola B, the LLRs associated with coded bits can be calculated based on associated received QAM symbols as well as corresponding channel state information. Such an LLR calculation proposed in that paper, however, does not consider and describe how to take into account the hard decision (HD) associated with the QAM symbols provided by the inner code, and thus is not suitable for scheme with LDPC code cascaded with an inner code.

In US Patent Publication No. 2007/0260959, it calculates LLRs based on QAM symbols, and employ skill of piecewise linear approximation. However, they still do not consider the use of hard decision (HD) information associated with the QAM symbols. Furthermore, it considers AWGN channel only, instead of multi-path channels as encountered in practical terrestrial broadcasting environment.

Though not mentioned insofar, it is desirable to devise and provide a complete decoding system applicable to wireless systems that employ LDPC code cascaded with an inner code, such as 4QAM-NR code, to mitigate and/or obviate problems encountered in versatile practical wireless channels for terrestrial broadcasting.

SUMMARY OF THE INVENTION

The main object of the present invention is to provide a decoding system of Low-density Parity-check code (LDPC code) cascaded with 4 Quadrature Amplitude Modulation Nordstrom-Robinson code (4QAM-NR code) for use in a digital television/terrestrial multimedia broadcast (DTMB) system, that can achieve satisfactory decoding performance via assistance of known Channel State Information (CSI) and hard decision (HD) information provided by inner decoder. The proposed concepts and approaches are suitable for both single-carrier and OFDM-based multi-carrier systems to decode the LDPC code at excellent performance when cascaded with an inner code.

The salient feature in the present invention is that the proposed decoding system is completed in successive two independent stages. Namely, the inner 4QAM-NR code is decoded to thereby obtain hard decision (HD) information for being applied to calculate the LLRs needed for the followed LDPC decoding. Toward this end, the decoding system of the invention includes a channel estimator and equalizer, a data partition device, an NR decoder, a time de-interleaver, a noise power estimator, a log-likelihood ratio (LLR) computation device and an LDPC decoder. The channel estimator and equalizer receives input signals $y_n$ to accordingly produce a plurality of estimation input signals $\overline{Y}_k$ and corresponding channel estimation signals $\hat{C}_k$. The data partition device is connected to the channel estimator and equalizer in order to perform a data partition on the estimation input signals $\overline{Y}_k$ and the corresponding channel estimation signals $\hat{C}_k$ to thereby produce a plurality of partition estimation input signals $Z_{8\times 1}$ and corresponding partition channel estimation signals $\tilde{H}_{8\times 1}$. The NR decoder is connected to the data partition device in order to perform a decoding operation on the partition estimation input signals $Z_{8\times 1}$ and the corresponding partition channel estimation signals $Z_{8\times 1}$ to thereby produce a plurality of symbols $\hat{X}_{4\times 1}$ and correspondingly partial partition estimation input signals $Z_{4\times 1}$ and partition channel estimation signals $\tilde{H}_{4\times 1}$. The time de-interleaver is connected to the NR decoder in order to produce a plurality of time de-interleaved symbols $\hat{X}_{d,k}$ and correspondingly time de-interleaved partition estimation input signals $Z_{d,k}$ and partition channel estimation signals $\tilde{H}_{d,k}$ based on the plurality of symbols $\hat{X}_{4\times 1}$ and the correspondingly partial partition estimation input signals $Z_{4\times 1}$ and partition channel estimation signals $\tilde{H}_{4\times 1}$. The noise power estimator estimates a noise power of the correspondingly time de-interleaved partition estimation input signals $Z_{d,k}$ and produces a noise variance $\sigma^2$. The log-likelihood ratio (LLR) computation device is connected to the noise power estimator and the time de-interleaver in order to compute and produce an LLR based on the plurality of time de-interleaved symbols $\hat{X}_{d,k}$, the correspondingly time de-interleaved partition estimation input signals $Z_{d,k}$ and partition channel estimation signals $\tilde{H}_{d,k}$ and the noise variance $\sigma^2$. The LDPC decoder is connected to the LLR computation device in order to produce a codeword based on the LLR.

Other objects, advantages, and novel features of the invention will become more apparent from the following detailed description when taken in conjunction with the accompanying drawings.

DETAILED DESCRIPTION OF THE PREFERRED EMBODIMENT

Figure 4:
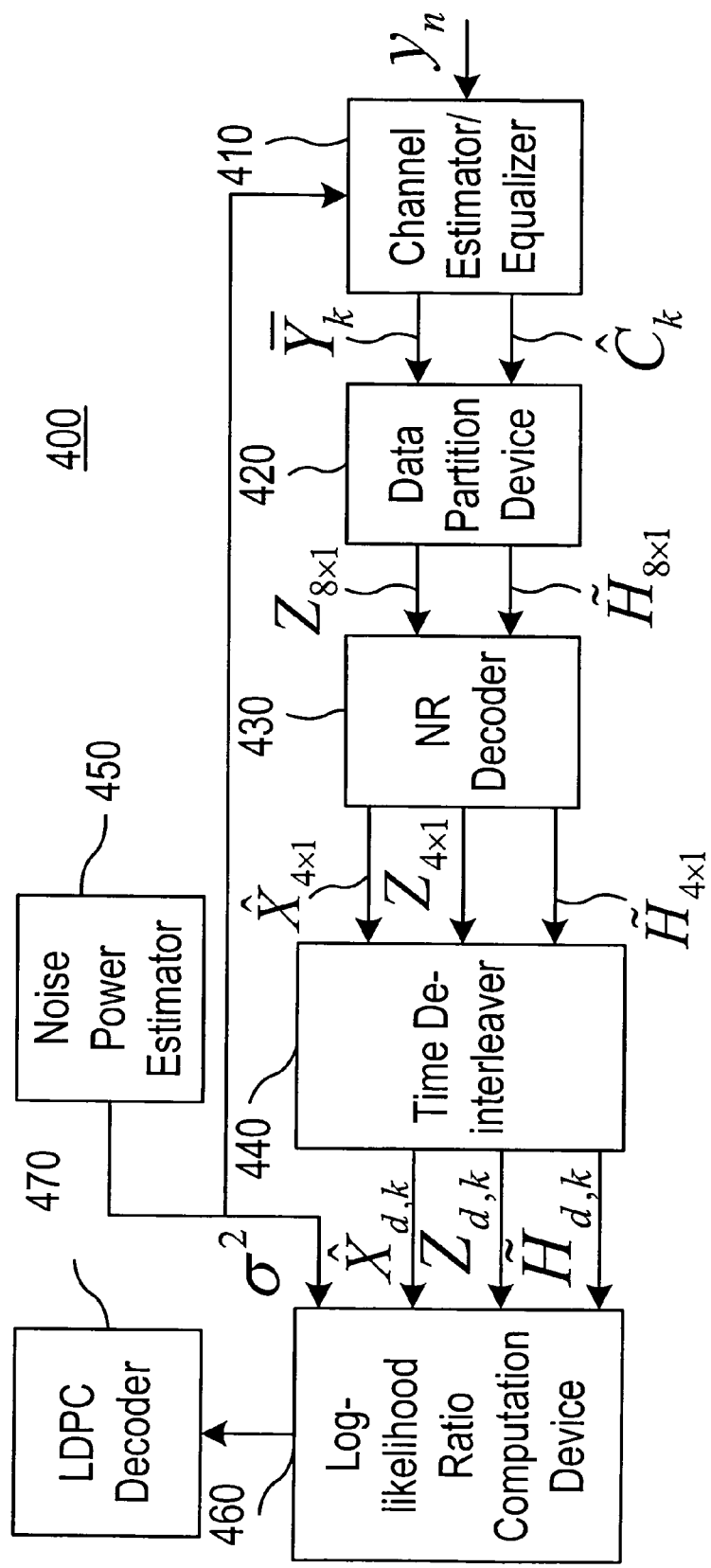
FIG. 4 is a block diagram of a decoding system for cascaded LDPC code and 4QAM-NR code according to an embodiment of the invention.

FIG. 4 is a block diagram of a decoding system 400 for a cascaded Low-density Parity-check code (LDPC code) and 4 Quadrature Amplitude Modulation Nordstrom-Robinson code (4QAM-NR code) in a receiver of a digital television/terrestrial multimedia broadcast (DTMB) system according to an embodiment of the invention. In FIG. 4, the system 400 includes a channel estimator and equalizer 410, a data partition device 420, an NR decoder 430, a time de-interleaver 440, a noise power estimator 450, a log-likelihood ratio (LLR) computation device 460 and an LDPC decoder 470.

The channel estimator and equalizer 410 receives input signals $y_n$ to accordingly produce a plurality of estimation input signals $\overline{Y}_k$ and corresponding channel estimation signals $\hat{C}_k$. The data partition device 420 is connected to the channel estimator and equalizer 410 in order to perform a data partition on the estimation input signals $\overline{Y}_k$ and the corresponding channel estimation signals $\hat{C}_k$ to thereby produce a plurality of partition estimation input signals $Z_{8\times1}$ and corresponding partition channel estimation signals $H_{8\times1}$.

The NR decoder 430 is connected to the data partition device 420 in order to perform a decoding operation on the partition estimation input signals $Z_{8\times1}$ and the corresponding partition channel estimation signals $H_{8\times1}$ to thereby produce a plurality of symbols $\hat{X}_{4\times1}$ and correspondingly partial partition estimation input signals $Z_{4\times1}$ and partition channel estimation signals $\tilde{H}_{4\times1}$.

The time de-interleaver 440 is connected to the NR decoder 430 in order to produce a plurality of time de-interleaved symbols $\hat{X}_{d,k}$ and correspondingly time de-interleaved partition estimation input signals $Z_{d,k}$ and partition channel estimation signals $\tilde{H}_{d,k}$ based on the plurality of symbols $\hat{X}_{4\times1}$ and the correspondingly partial partition estimation input signals $Z_{4\times1}$ and partition channel estimation signals $\tilde{H}_{4\times1}$.

The noise power estimator 450 estimates a noise power of the correspondingly time de-interleaved partition estimation input signals $Z_{d,k}$ and produces a noise variance $\sigma^2$. The log-likelihood ratio (LLR) computation device 460 is connected to the noise power estimator 450 and the time de-interleaver 440 in order to compute and produce an LLR based on the plurality of time de-interleaved symbols $\hat{X}_{d,k}$, the correspondingly time de-interleaved partition estimation input signals $Z_{d,k}$ and partition channel estimation signals $\tilde{H}_{d,k}$, and the noise variance $\sigma^2$.

The LDPC decoder 470 is connected to the LLR computation device 460 in order to produce a codeword based on the LLR.

Figure 5:
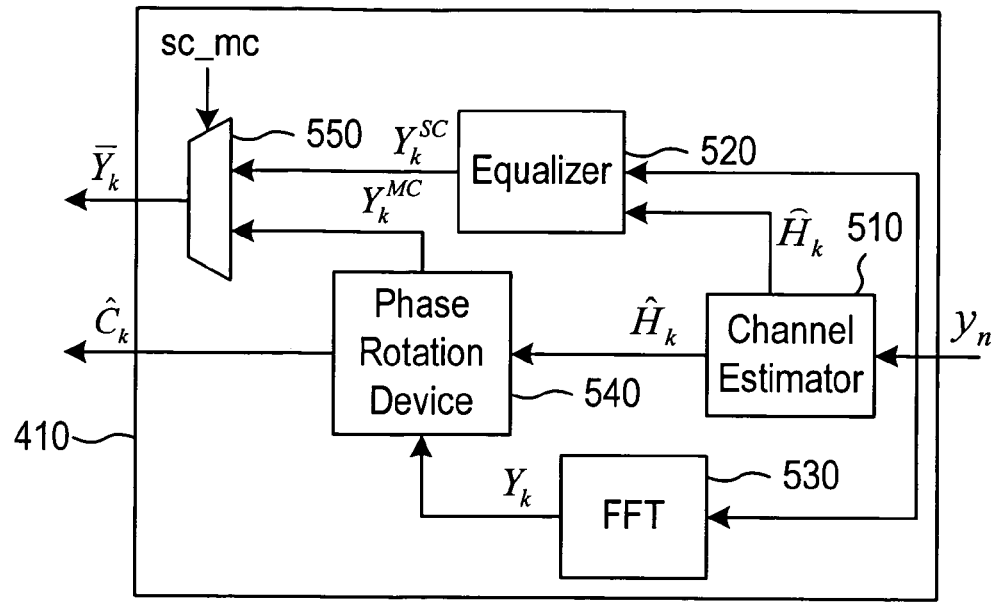
FIG. 5 is a block diagram of a channel estimator and equalizer according to an embodiment of the invention.

FIG. 5 is a block diagram of the channel estimator and equalizer 410 according to an embodiment of the invention. In FIG. 5, the channel estimator and equalizer 410 includes a channel estimator 510, an equalizer 520, a fast Fourier transform (FFT) device 530, a phase rotation device 540 and a first multiplexer 550.

The channel estimator 510 receives the input signals $y_n$ and produces a plurality of estimation channel frequency responses (CFRs) $\hat{H}_k$ and a plurality of estimation channel impulse responses (CIRs) $\hat{H}_k$.

The channel estimator 510 further performs an FFT or inverse FFT to produce the CFRs or the CIRs, for example, CFR=FFT{CIR} or CIR=IFFT{CFR}, as can be seen in the IEEE paper "Iterative Padding Subtraction of the PN Sequence for the TDS-OFDM over Broadcast Channels" proposed by J. Wang, et al. in IEEE Transactions on Consumer Electronics, Vol. 51, No. 4, November 2005.

The equalizer 520 is connected to the channel estimator 510 in order to produce a single-carrier input signal $Y_k^{SC}$ based on the input signals $y_n$ and the estimation CIRs $\hat{H}_k$.

At the single carrier mode, the single carrier input signal $Y_k^{SC}$ can be obtained by performing the frequency domain equalization (FDE). For example, $Y_k^{SC}$ is obtained by the following process:

$$Y_n \rightarrow FFT \rightarrow FDE(MMSE) \rightarrow IFFT \rightarrow Y_k^{SC},$$

which is based on the minimum mean square error (MMSE) criteria as can be seen in the IEEE paper "Transmission Techniques for Digital Terrestrial TV Broadcasting" proposed by H. Sari et al. in IEEE Communications Magazine, Feb 1995. Here, FDE is used for illustration. In practice, the other equalization skills can also be employed at single carrier mode.

The fast Fourier transform (FFT) device 530 receives the input signals $y_n$ and performs an FFT operation on the input signals $y_n$ to thereby produce a plurality of estimation frequency input signals $\overline{Y}_k$.

The phase rotation device 540 is connected to the channel estimator 510 and the FFT device 530 in order to produce the corresponding channel estimation signals $\hat{C}_k$ and a multi-carrier input signal $Y_k^{MC}$ based on the estimation CFRs $\hat{H}_k$ and the estimation frequency input signals $Y_k$. The channel estimation signals $\hat{C}_k$ can be expressed as:

$$\hat{C}_k = \hat{H}_k \cdot e^{-j\angle \hat{H}_k} = |\hat{H}_k|,$$

where $\hat{H}_k$ denotes the estimation CFR. The multi-carrier input signal $Y_k^{MC}$ can be expressed as:

$$Y_k^{MC} = Y_k \cdot e^{-j\angle \hat{H}_k},$$

where $Y_k$ denotes the estimation frequency input signals, and $\hat{H}_k$ denotes the estimation CFRs.

The first multiplexer 550 is connected to the equalizer 520 and the phase rotation device 540 in order to select the single-carrier input signal $Y_k^{SC}$ or the multi-carrier input signal $Y_k^{MC}$ as the estimation input signals $\overline{Y}_k$ based on a single-carrier/multi-carrier indicator sc_mc.

Specifically, when the signal sc_mc indicates a single carrier, the first multiplexer 550 selects the single carrier input signal $Y_k^{SC}$ as the plurality of estimation input signals $\overline{Y}_k$, and conversely the first multiplexer 550 selects the multi-carrier input signal $Y_k^{MC}$.

Figure 1:
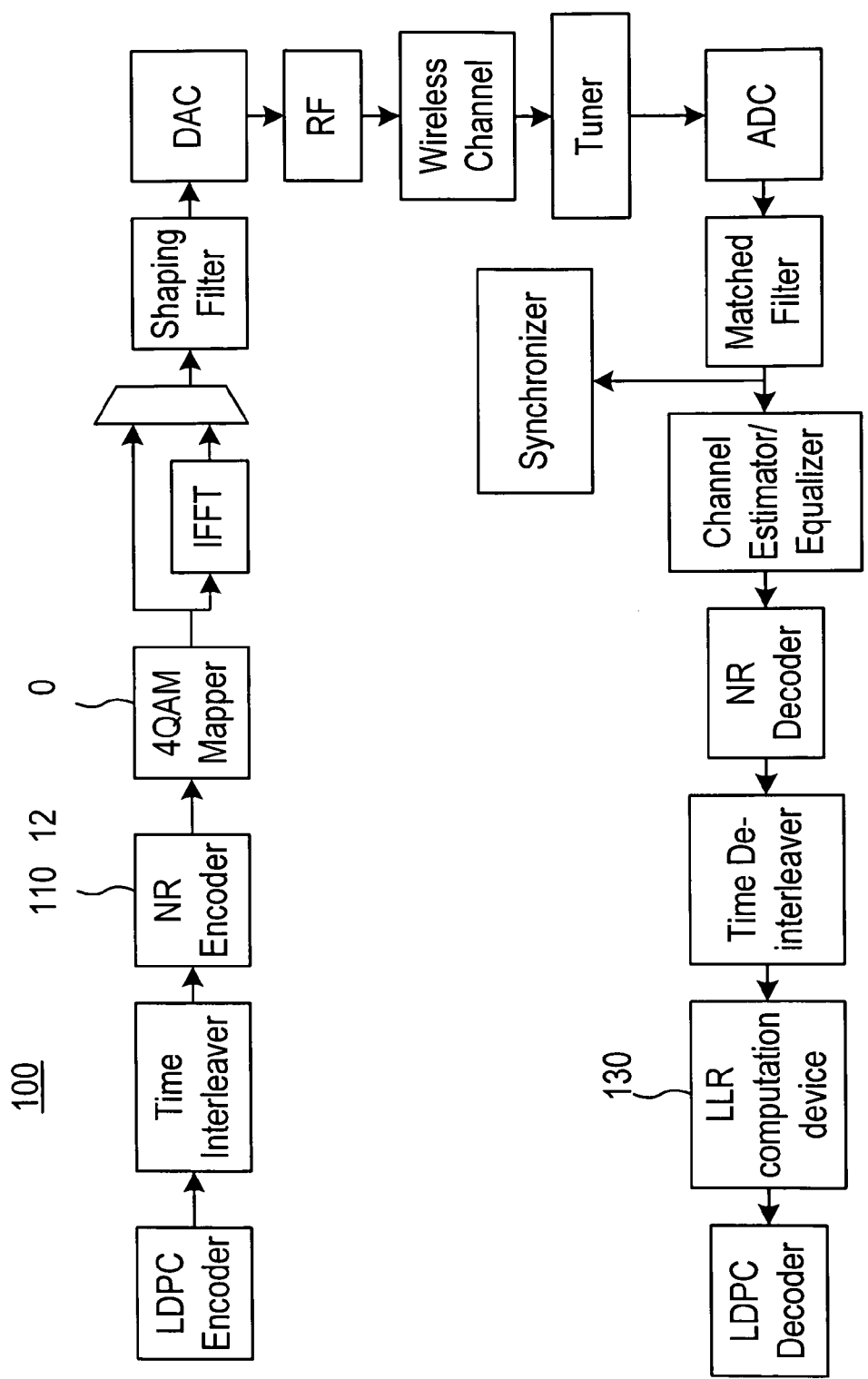
FIG. 1 is a configuration of a typical digital television/ terrestrial multimedia broadcast (DTMB) system including LDPC and 4QAM-NR code concatenation.
Figure 2:
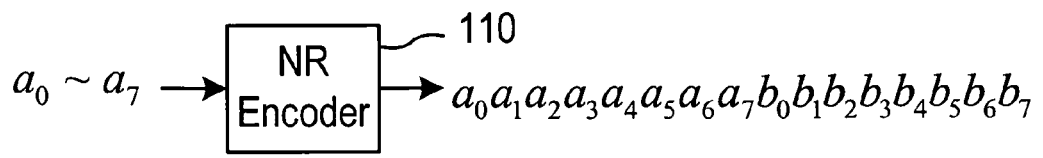
FIG. 2 is an operation of a typical Nordstrom-Robinson (NR) encoder.
Figure 3:
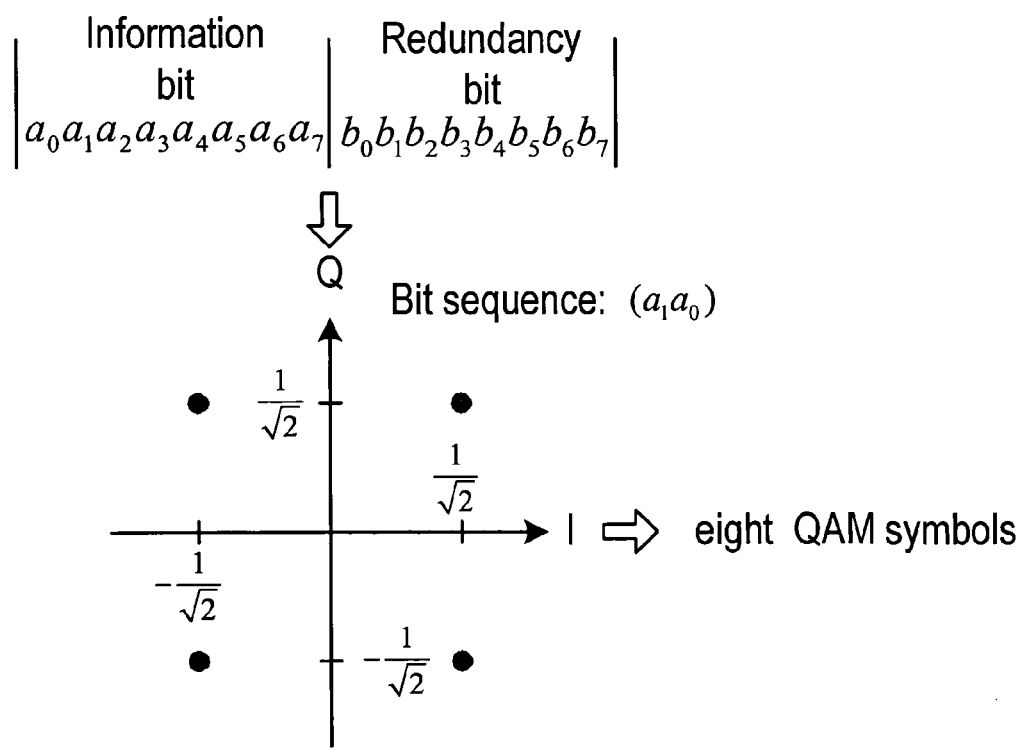
FIG. 3 is an operation of a typical 4-Quadrature Amplitude Modulation (4QAM) mapper.

As shown in FIG. 3, eight information bits and eight redundancy bits passed through the 4QAM mapper 120 become eight QAM symbols. Accordingly, the data partition device 420 performs a data partition operation on the estimation input signals $\overline{Y}_k$ and the corresponding channel estimation signals $\hat{C}_k$ based on a set of successive eight symbols to thereby produce the partition estimation input signals $Z_{8\times1}$ and the corresponding partition channel estimation signals $\tilde{H}_{8\times1}$, where $Z_{8\times1}$ denotes a set of QAM symbols (in this case, eight) after the data partition.

In other embodiments, $Z_{8\times1}$ can be obtained by arbitrarily partitioning $\overline{Y}_k$. For example, $\overline{Y}_k$ is partitioned into $(\overline{Y}_{8I_p}, \overline{Y}_{8I_p+1}, \ldots, \overline{Y}_{8I_p+7})$, where $I_p$ denotes a partition index, $0 \leq I_p \leq N_{MP}$, and $N_{MP}$ denotes a possible maximum of $\overline{Y}_k$ to be partitioned.

The NR decoder 430 is based on the minimum distance estimation to perform a decoding operation on the partition estimation input signals $Z_{8\times1}$ and the corresponding partition channel estimation signals $\tilde{H}_{8\times1}$.

Figure 6:
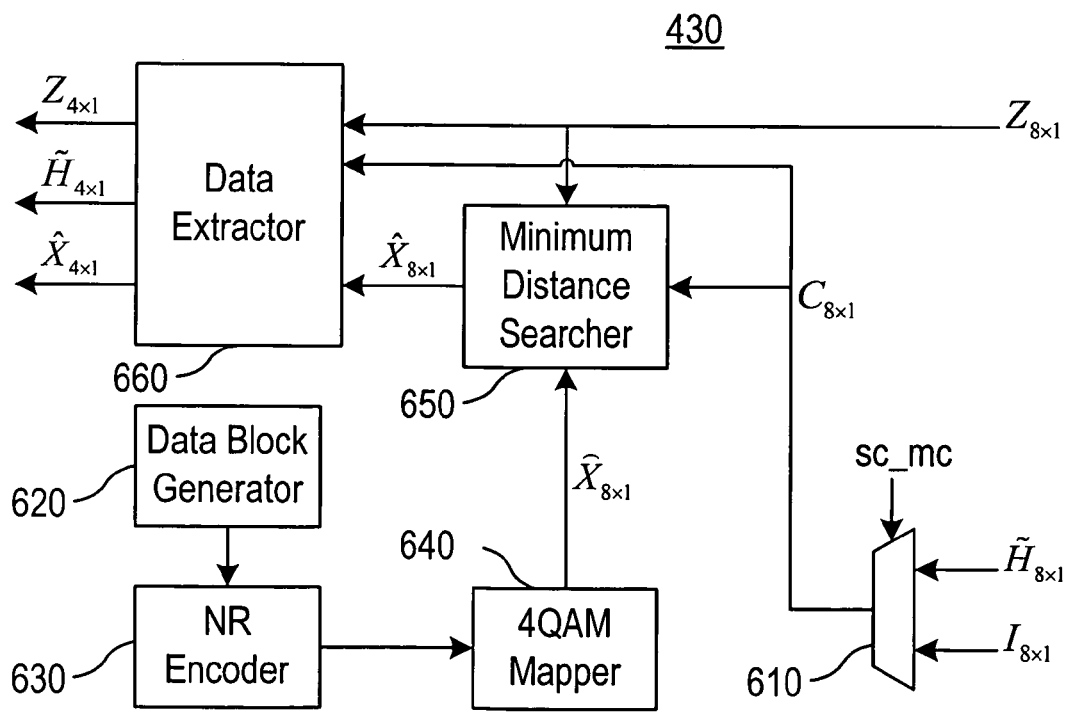
FIG. 6 is a block diagram of an NR decoder according to an embodiment of the invention.

FIG. 6 is a block diagram of the NR decoder 430 according to an embodiment of the invention. In FIG. 6, the NR decoder 430 includes a second multiplexer 610, a data block generator 620, an NR encoder 630, a 4QAM mapper 640, a minimum distance searcher (MDS) 650 and a data extractor 660.

The second multiplexer 610 is based on the single-carrier/multi-carrier indicator sc_mc to select the partition channel estimation signals $\tilde{H}_{8\times1}$ or a unit of vectors $I_{8\times1}$ to thereby produce a temporary channel estimation signal $C_{8\times1}$. Here, the unit vector contains all-one elements.

Specifically, when sc_mc indicates the single carrier, the second multiplexer 610 selects the partition channel estimation signals $\tilde{H}_{8\times1}$ to produce the temporary channel estimation signal $C_{8\times1}$, and conversely the second multiplexer 610 selects the unit of vectors $I_{8\times1}$.

The data block generator 620 produces and lists extensively all possible binary comparative data consisting of 16 bits. The NR encoder 630 is connected to the data block generator 620 in order to perform an NR coding on the binary comparative data to thereby produce an NR symbol. The 4QAM mapper 640 is connected to the NR encoder 630 in order to map the NR symbol into a comparative symbol $\hat{X}_{8\times1}$.

The minimum distance searcher (MDS) 650 is connected to the data partition device 420, the second multiplexer 610 and the 4QAM mapper 640 in order to produce a plurality of symbols $\hat{X}_{8\times1}$ based on the comparative symbol $\hat{X}_{8\times1}$, the temporary channel estimation signal $C_{8\times1}$ and the partition estimation input signals $Z_{8\times1}$.

For every eight QAM symbols, the minimum distance searcher 650 is based on the following equation (1) to select and produce the eight symbols:

$$\tilde{X}_{8\times1} = \arg\min_{\hat{X}_{8\times1}} \sum_{i=1}^{8} |Z_{8\times1}^i - \hat{X}_{8\times1}^i * C_{8\times1}^i|^2, \quad (1)$$

where i denotes a symbol index, $Z_{8\times1}^i$ denotes the i-th component of eight partition estimation input signals $Z_{8\times1}$, $\hat{X}_{8\times1}$ denotes an i-th component of the comparative symbol $\hat{X}_{8\times1}$, and $C_{8\times1}^i$ denotes an $i^{th}$ component of the temporary channel estimation signal $C_{8\times1}$. It can be known from equation (1) that the minimum distance searcher 650 produces the eight symbols $\hat{X}_{8\times1}$ by considering the information bits ($a_0 \ldots a_7$) and the redundancy bits ($b_0 \ldots b_7$) to thereby leverage the decoding gain of NR code.

The data extractor 660 is connected to the minimum distance searcher 650, the second multiplexer 610 and the data partition device 420 in order to extract the data from the partition estimation input signals $Z_{8\times1}$, the temporary channel estimation signals $C_{8\times1}$ and the symbols $\hat{X}_{8\times1}$ to thereby produce the symbols $\hat{X}_{4\times1}$ and the correspondingly partial partition estimation input signals $Z_{4\times1}$ and partition channel estimation signals $\tilde{H}_{4\times1}$.

The data extractor 660 extracts the first four components respectively from the partition estimation input signals $Z_{8\times1}$, the temporary channel estimation signal $C_{8\times1}$ and the comparative symbol $\hat{X}_{8\times1}$ to thereby produce the symbols $\hat{X}_{4\times1}$ and the correspondingly partial partition estimation input signals $Z_{4\times1}$ and partition channel estimation signals $\tilde{H}_{4\times1}$.

Since the first four QAM symbols indicate the eight information bits and the remaining four QAM symbols indicate the eight redundancy bits, the decoding process keeps the first four QAM symbols and associated channel signals, and discards the remaining four QAM symbols. Specifically, the first four components are extracted from the partition estimation input signals $Z_{8\times1}$ to thereby produce the symbols $\hat{X}_{4\times1}$, the first four components are extracted from the temporary channel estimation signals $C_{8\times1}$ to thereby produce the correspondingly partial partition estimation input signals $Z_{4\times1}$, and the first four components are extracted from the symbols $\hat{X}_{8\times1}$ to thereby produce the correspondingly partial partition channel estimation signals $\tilde{H}_{4\times1}$.

The time de-interleaver 440 performs a de-interleaving operation on the symbols $\hat{X}_{4\times1}$ and the corresponding partial partition estimation input signals $Z_{4\times1}$ and partition channel estimation signals $\tilde{H}_{4\times1}$ to thereby produce the time de-interleaved symbols $\hat{X}_{d,k}$ and the corresponding time de-interleaved partition estimation input signals $Z_{d,k}$ and partition channel estimation signals $\tilde{H}_{d,k}$. The time-domain de-interleaving operation is known to those skilled in the art, and thus a detailed description is deemed unnecessary.

A noise variance $\sigma^2$ produced by the power estimator 450 denotes a noise power. In this case, the estimation CFRs, the estimation CIRs and the noise variance $\sigma^2$ are generally referred to as the channel state information (CSIs).

Other possible approaches shown in open literatures can also be employed to replace the NR decoder 430 and Channel Estimator/Equalizer 410 mentioned in this invention.

Figure 7:
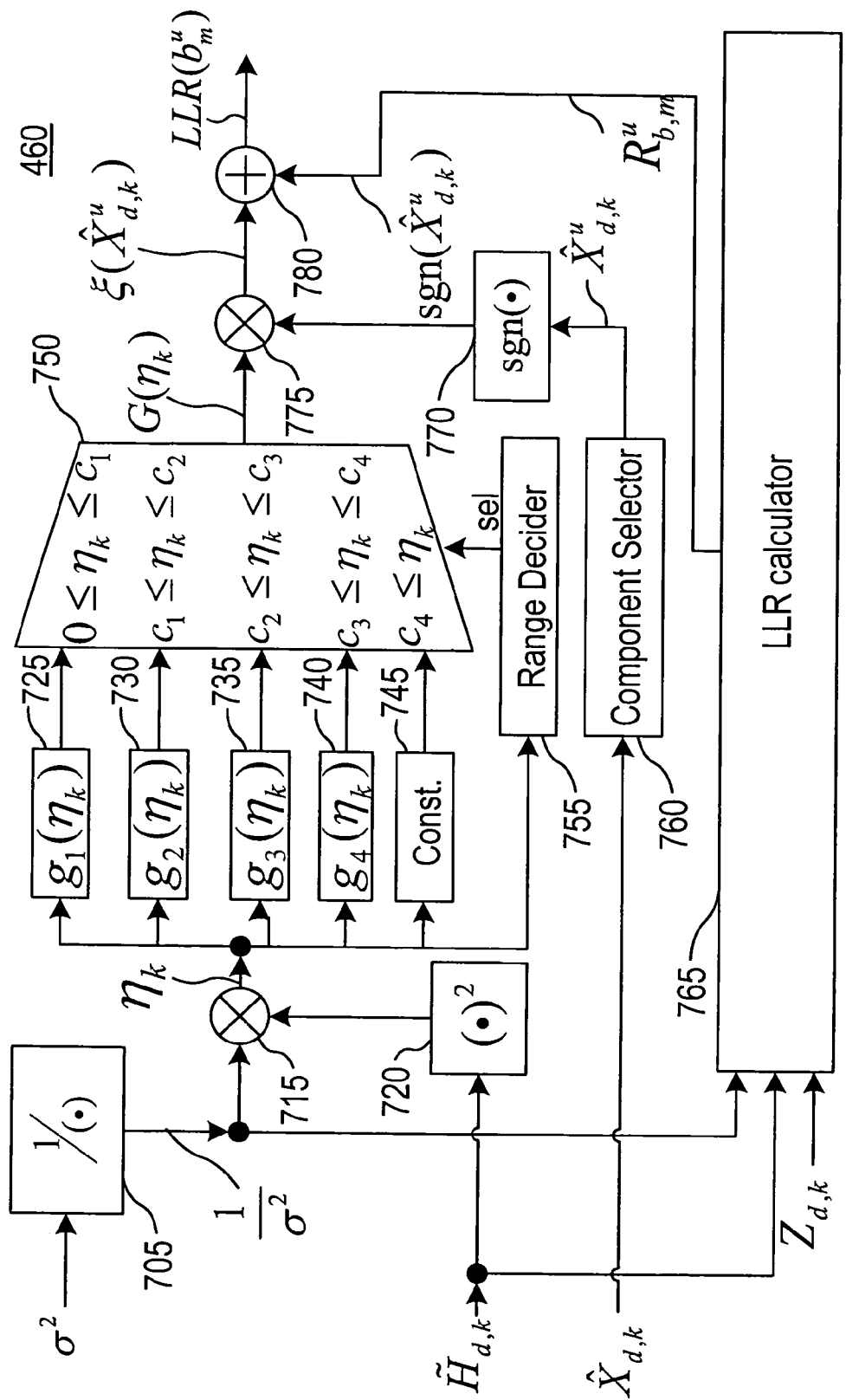
FIG. 7 is a block diagram of a log-likelihood ratio (LLR) computation device according to an embodiment of the invention.

FIG. 7 is a block diagram of the log-likelihood ratio (LLR) computation device 460 according to an embodiment of the invention. In FIG. 7, the LLR computation device 460 includes an inverse device 705, a first multiplier 715, a square device 720, function generators 725-745, a selector 750, a range decider 755, a component selector 760, an LLR calculator 765, a sign device 770, a second multiplier 775 and an adder 780.

Let $\eta_k \equiv |H_{d,k}|^{2*} |X_{d,k}|^2/\sigma^2$ denote the signal to noise power ratio (SNR) on the $k^{th}$ subcarrier. The following two facts can be employed to simplify implementation of $\eta_k$ defined above. (a). Under perfect channel estimation assumption as will be assumed hereafter, it knows by definition that $\tilde{H}_{d,k}$ is a non-negative real number so that $|\tilde{H}_{d,k}|^2 = (\tilde{H}_{d,k})^2$. $|\tilde{X}_{d,k}|^2 = 1$ at 4QAM modulation as defined in FIG. 3. These two facts lead to simple form $\eta_k = (\tilde{H}_{d,k})^2/\sigma^2$ that can be realized easily as to be stated next.

The inverse device 705 is connected to the noise power estimator 450 in order to perform an inverse transformation on the noise variance $\sigma^2$ to thereby produce the inverse $$\frac{1}{\sigma^2}$$

of the noise variance $\sigma^2$. The square device 720 is connected to the time de-interleaver 440 in order to perform a square operation on the corresponding time de-interleaved partition channel estimation signals $\tilde{H}_{d,k}$ of the time de-interleaver 440 to thereby produce a square $(\tilde{H}_{d,k})^2$ of the corresponding time de-interleaved partition channel estimation signals $\tilde{H}_{d,k}$. The first multiplier 715 is connected to the inverse device 705 and the square device 720 in order to multiply by $$\frac{1}{\sigma^2}$$

by $(\tilde{H}_{d,k})^2$ to thereby produce $\eta_k = (\tilde{H}_{d,k})^2/\sigma^2$.

Under perfect channel estimation assumption as will be assumed hereafter, it knows by definition that $\tilde{H}_{d,k}$ is a non-negative real number so that $|\tilde{H}_{d,k}|^2 = (\tilde{H}_{d,k})^2 - |\tilde{X}_{d,k}|^2 = 1$ at 4QAM modulation as defined in FIG. 3. These two facts lead to a simple form $\eta_k = (\tilde{H}d,k)\sigma^2$ that can be realized easily as to be stated next.

The function generators 725-745 are connected to the first multiplier 715 in order to produce a predetermined value based on $\eta_k$, and the function generator 745 connected to the first multiplier 715 produces a constant which is not related to $\eta_k$.

The range decider 755 is connected to the first multiplier 715 in order to produce a select signal 'sel' based on $\eta_k$. The selector 750 is connected to the function generators 725-745 and the range decider 755 in order to select one as an output $G(\eta_k)$ from the outputs of the function generators 725-745 based on the select signal sel. When $0 \leq \eta_k \leq c_1$, the selector 750 selects the output $g_1(\eta_k)$ of the function generator 725 as the output $G(\eta_k)$. When $c_1 \leq \eta_k \leq c_2$, the selector 750 selects the output $g_2(\eta_k)$ of the function generator 730 as the output $G(\eta_k)$. When $c_2 \leq \eta_k \leq c_3$, the selector 750 selects the output $g_3(\eta_k)$ of the function generator 735 as the output $G(\eta_k)$. When $c_3 \leq \eta_k \leq c_4$, the selector 750 selects the output $g_4(\eta_k)$ of the function generator 740 as the output $G(\eta_k)$. When $C_4 \leq \eta_k$, the selector 750 selects the output $g_5(\eta_k)$ of the function generator 725 as the output $G(\eta_k)$. By employing piece-wise linear approximation in this case, five linear function generators 725-745 are used to output $g_{1(\eta_k)}$, $g_2(\eta_k)$, $g_3(\eta_k)$, $g_4(\eta_k)$ and $g_5(\eta_k)$ respectively, and the selector 750 accordingly produces an output of the following equation:

$$G(\eta_k) = \log\left\{\frac{1 - \frac{\sqrt{\pi}}{2}[2Q(\sqrt{\eta_k}) - 1]}{1 + \frac{\sqrt{\pi}}{2}[2Q(\sqrt{\eta_k}) - 1]}\right\}, \quad (2)$$

where $$Q(x) \equiv \frac{1}{\sqrt{2\pi}} \int_x^\infty e^{-t^2/2} dt$$

is a Q-function. In other embodiments, a look-up table can be used to produce $G(\eta_k)$.

The component selector 760 is connected to the time de-interleaver 440 in order to select the real or imaginary component of the time de-interleaved symbols $\hat{X}_{d,k}^u$ to thereby produce $\hat{X}_{d,k}^u$. Throughout this invention, $$C^\mu \equiv \begin{cases} \text{Re}\{C\}, & \mu = I \\ \text{Im}\{C\}, & \mu = Q \end{cases}$$

for any complex number C. The sign device 770 is connected to the component selector 760 in order to determine the sign of $\hat{X}_{d,k}^u$ based on a function of $\text{sgn}(\bullet)$.

The second multiplier 775 is connected to the sign device 770 and the selector 750 in order to multiply $G(\eta_k)$ by $\hat{X}_{d,k}^u$ to thereby produce a correction item $\xi(\hat{X}_{d,k}^u)$. The correction item $\xi(\hat{X}_{d,k}^u)$ can be expressed as:

$$\xi(\hat{X}_{d,k}^u) = \text{sgn}(\hat{X}_{d,k}^u) * G(\eta_k). \quad (3)$$

The LLR calculator 765 is connected to the time de-interleaver 440 and the inverse device 705. The LLR computation device 460 produces an LLR without the hard-decision (HD) information, i.e., a non-hard-decision-assisted LLR $R_{b,m}^\mu$, based on the inverse of the noise variance, the time de-interleaved symbols $\hat{X}_{d,k}^\mu$, the correspondingly time de-interleaved partition estimation input signals $Z_{d,k}$ and the correspondingly time-interleaved partition channel estimation signals $\tilde{H}_{d,k}$. The non-hard-decision-assisted LLR $R_{b,m}^\mu$ can be expressed as:

$$R_{b,m}^\mu = \frac{1}{2\sigma^2}\left\{\min_{\alpha \in S_{\mu,m}^{(1)}}(Z_{d,k}^\mu - \alpha^\mu * \tilde{H}_{d,k})^2 - \min_{\alpha \in S_{\mu,m}^{(0)}}(Z_{d,k}^\mu - \alpha^\mu * \tilde{H}_{d,k})^2\right\}. \quad (4)$$

Figure 8:
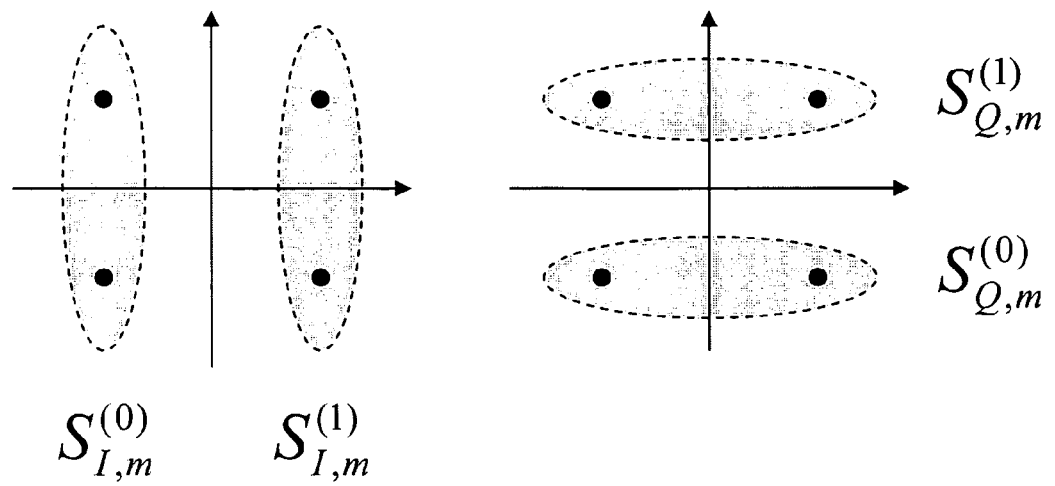
FIG. 8 is a schematic graph of $S_{u,m}^{(0)}$ and $S_{u,m}^{(1)}$ distributions according to definition in prior art.

$\tilde{H}_{d,k}$ denotes the correspondingly time-deinterleaved partition channel estimation signals, i.e., the channel gain obtained when the time de-interleaved symbols $\hat{X}_{d,k}^u$ are applied. At 4QAM mode, the distributions of $S_{\mu,m}^{(0)}$ and $S_{\mu,m}^{(1)}$ ($u \in I, Q$) are defined in the IEEE paper "Simplified Soft-Output Demapper for Binary Interleaved COFDM with Application to HIPERLAN/2" proposed by Filippo T. and Paola B and are repeated as shown in FIG. 8.

In considering 4QAM, $|\hat{X}_{d,k}|^2$ in equation (4) is a constant. Thus, we may let $|\hat{X}_{d,k}|^2 = 1$ for simplicity without loss of generality. Accordingly, the time de-interleaved symbols $\hat{X}_{d,k}$ can be omitted in practice to calculate the non-hard-decision-assisted LLR $R_{b,m}^u$ in equation (4).

Let M denote the number of bits needed in generating a QAM symbol and B denote a sequence of modulation bits to form a QAM symbol, i.e. $B = (b_1^I, b_2^I, \ldots, b_{M/2-1}^I, b_{M/2}^I, b_1^Q, b_2^Q, \ldots, b_2^Q, \ldots, b_{M/2-1}^Q, b_{M/2}^Q)$.

In equation (4), m denotes an index applied to computing $b_m^\mu$, where $0 \leq M/2$.

The adder 780 is connected to the second multiplier 775 and the LLR calculator 765, respectively. The adder 780 adds the correction item $\xi(\hat{X}_{d,k}^\mu)$ to the non-hard-decision-assisted LLR $R_{b,m}^\mu$ to thereby produce an LLR expressed below:

$$LLR(b_m^\mu) = \log \frac{\Pr[b_m^\mu = 1 | Z_{d,k}^\mu, \tilde{H}_{d,k}, \hat{X}_{d,k}^\mu]}{\Pr[b_m^\mu = 0 | Z_{d,k}^\mu, \tilde{H}_{d,k}, \hat{X}_{d,k}^\mu]} = R_{b,m}^\mu + \xi(\hat{X}_{d,k}^\mu), \quad (5)$$

where $R_{b,m}^\mu$ denotes the non-hard-decision-assisted LLR.

The detailed derivation for equation (5) is described as follows. Extended from the concept originated from the IEEE paper "Simplified Soft-Output Demapper for Binary Interleaved COFDM with Application to HIPERLAN/2" proposed by Filippo T. and Paola B, it is understood that if the transmitting symbol $\hat{X}_{d,k} = \beta_k$, the corresponding channel characteristics $\tilde{H}_{d,k}$ and the corresponding received symbols $Z_{d,k}$ can be derived from the fore-mentioned procedures related to FIG. 4~6, the LLR can be computed by definition as follows:

$$LLR(b_m^\mu) \equiv \log \frac{\Pr[b_m^\mu = 1 | Z_{d,k}, \tilde{H}_{d,k}, \hat{X}_{d,k} = \beta_k]}{\Pr[b_m^\mu = 0 | Z_{d,k}, \tilde{H}_{d,k}, \hat{X}_{d,k} = \beta_k]} \quad (6)$$

$$= \log \frac{\sum_{\alpha \in S_{\mu,m}^{(1)}} \Pr[X_{d,k} = \alpha | Z_{d,k}, \tilde{H}_{d,k}, \hat{X}_{d,k} = \beta_k]}{\sum_{\alpha \in S_{\mu,m}^{(0)}} \Pr[X_{d,k} = \alpha | Z_{d,k}, \tilde{H}_{d,k}, \hat{X}_{d,k} = \beta_k]}.$$

After some manipulating and by taking into account conclusions drawn from the IEEE paper "Simplified Soft-Output Demapper for Binary Interleaved COFDM with Application to HIPERLAN/2" proposed by Filippo T. and Paola B, equation (7) can be derived from equation (6) as shown below:

$$LLR(b_m^\mu) = \underset{\alpha \in S_{\mu,m}^{(1)}}{\operatorname{Max}} \log \quad (7)$$

$$\{\Pr[\hat{X}_{d,k} = \beta_k | Z_{d,k}, X_{d,k} = \alpha, \tilde{H}_{d,k}] * \Pr[Z_{d,k} | X_{d,k} = \alpha, \tilde{H}_{d,k}]\} -$$

$$\underset{\alpha \in S_{\mu,m}^{(0)}}{\operatorname{Max}} \log\{\Pr[\hat{X}_{d,k} = \beta_k | Z_{d,k}, X_{d,k} = \alpha, \tilde{H}_{d,k}] *$$

$$\Pr[Z_{d,k} | X_{d,k} = \alpha, \tilde{H}_{d,k}]\},$$

where $X_{d,k}$ denotes the content of the transmitted signal at the $k^{th}$ spectrum bin, $\tilde{H}_{d,k}$ denotes the corresponding estimated CFR, $Z_{d,k}$ denotes the content of the received signal at the $k^{th}$ spectrum bin at multi-carrier mode (or the $k^{th}$ equalized symbol at single-carrier mode), and $N_{d,k}$ denotes complex Gaussian-distributed channel noise with zero mean and variance $2\sigma^2$. In the IEEE paper "Simplified Soft-Output Demapper for Binary Interleaved COFDM with Application to HIPERLAN/2" proposed by Filippo T. and Paola B, $S_{\mu,m}^{(0)}$ and $S_{\mu,m}^{(1)}$ are defined and repeated as shown in FIG. 8 for 4QAM modulation.

Obviously, provided that channel estimation is perfect so that $\tilde{H}_{d,k} = h$ and $X_{d,k} = a$, $Z_{d,k}$ can be expressed by the following general form $$Z_{d,k} = X_{d,k} * \tilde{H}_{d,k} + N_{d,k} \quad (8)$$

and can be modeled by a complex Gaussian random variable characterized by mean ha and variance $2\sigma^2$. That is, $Z_{d,k} \sim N$ (ha,$2\sigma^2$). From FIG. 5 and FIG. 6, it is known that $\tilde{H}_{d,k} = 1$ at single carrier mode and equation (8) as well as the above model for $Z_{d,k}$ are still good approximation.

Figure 9:
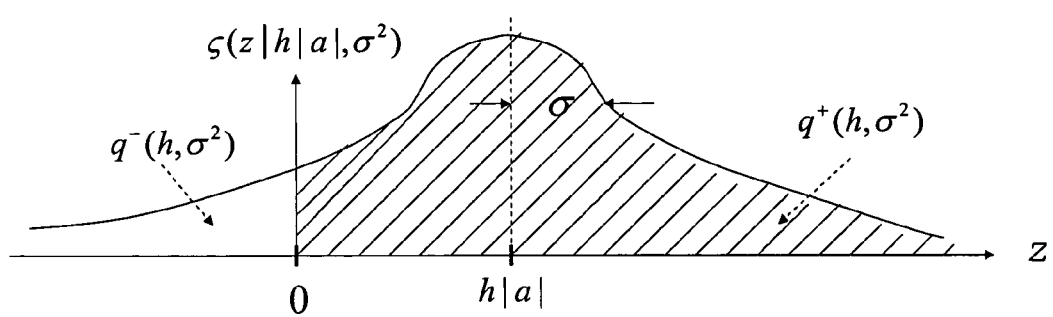
FIG. 9 is a schematic graph of probability density function (pdf) $\zeta(z|ha,\sigma^2)$ corresponding to a Gaussian random variable z with mean ha and variance $\sigma^2$ and $q^+(h,\sigma^2)$ and $q^-(h,\sigma^2)$ are probabilities corresponding to z being nonnegative and negative, respectively.

Let $Z_{d,k} \equiv Z_{d,k}^I + j*Z_{d,k}^Q$, then $Z_{d,k}^I, Z_{d,k}^Q$ are i.i.d. Gaussian random variables. For convenience, let's define a new random variable z such that $z = Z_{d,k}^\mu$ if $a^\mu \leq 0$ and $z = -Z_{d,k}^\mu$ if $a^\mu \geq 0$ where $a^\mu = Xd_{d,k}^\mu$ ($\mu = I$ or $Q$). Then, a probability density function (pdf) of z is defined in (9) as shown in FIG. 9.

$$\varsigma(z | h|a^\mu|, \sigma^2) \equiv \frac{1}{\sqrt{2\pi}\,\sigma} * \exp\left\{\frac{(z - h|a^\mu|)^2}{2\sigma^2}\right\}. \quad (9)$$

Let $q^+(h,\sigma^2)$ and $q^-(h,\sigma^2)$ denote the tail end probabilities corresponding, respectively, to the area in shaded region and the non-shaded region in FIG. 9 as defined below:

$$q^+(h, \sigma^2) \equiv \int_0^\infty \varsigma(z | h|a|, \sigma^2) dz, \quad (10)$$

and $$q^-(h, \sigma^2) \equiv \int_{-\infty}^0 \varsigma(z | h|a|, \sigma^2) dz. \quad (11)$$

By the above two definitions, it is obvious that $$q^+(h,\sigma_2) + q^-(h,\sigma^2) = 1. \quad (12)$$

Taking into account the fact revealed in equation (8), the conditional pdf in equation (7) can be derived as follows:

$$\Pr[Z_{d,k} | X_{d,k} = \alpha, \tilde{H}_{d,k}] = \Pr[Z_{d,k} = \alpha * \tilde{H}_{d,k} + N_{d,k} | X_{d,k} = \alpha, \tilde{H}_{d,k}] \quad (13)$$

$$= \Pr[N_{d,k} = Z_{d,k} - \alpha * \tilde{H}_{d,k}].$$

Let $X_{d,k} \equiv X_{d,k}^I + j*X_{d,k}^Q$, $N_{d,k} \equiv N_{d,k}^I + j*N_{d,k}^Q$, $\alpha \equiv \alpha^I + j*\alpha^Q$ and $\beta \equiv \beta^I + j*\beta^Q$.

Then, from the fact that $\tilde{H}_{d,k}$ is a real number under perfect channel estimation assumption, the conditional probability in equation (7) can be deduced as follows:

$$Pr[\hat{X}_{d,k} = \beta_k | Z_{d,k}, X_{d,k} = \alpha, \tilde{H}_{d,k}] = \quad (14)$$

$$\Pr[\hat{X}_{d,k}^I = \beta_k^I | Z_{d,k}^I = \alpha^I * \tilde{H}_{d,k} + N_{d,k}^I] *$$

$$\Pr[\hat{X}_{d,k}^Q = \beta_k^Q | Z_{d,k}^Q = \alpha^Q * \tilde{H}_{d,k} + N_{d,k}^Q].$$

According to relationship between resided quadrants of $\alpha$ and $\beta_k$, equation (14) equals three possible probabilities, $P_0$, $P_1$ and $P_2$, as shown below:

$$\Pr[\hat{X}_{d,k} = \beta_k | Z_{d,k}, X_{d,k} = \alpha, \tilde{H}_{d,k}] =$$

$$\begin{cases} P_0, & \alpha = \beta_k \\ P_1, & \alpha \text{ and } \beta_k \text{ locate at adjacent quadrants} \\ P_2, & \alpha \text{ and } \beta_k \text{ locate at opposite quadrants.} \end{cases}$$

For simplicity, denote the conditional probability shown in equation (14) by $f(\alpha,\beta_k)$. Then, $P_0$, $P_1$ and $P_2$ can be further derived as follows based on complex Gaussian assumption made for $Z_{d,k}$:

$$\Pr[\hat{X}_{d,k}^\mu = \beta_k^\mu | Z_{d,k}^\mu, X_{d,k} = \alpha^\mu, \tilde{H}_{d,k}] \quad (15)$$
$$= \Pr[\hat{X}_{d,k}^\mu = \beta_k^\mu | Z_{d,k}^\mu = \alpha^\mu * \tilde{H}_{d,k} + N_{d,k}^\mu]$$
$$= \begin{cases} \int_0^\infty \varsigma(z | |\alpha^\mu| * \tilde{H}_{d,k}, \sigma^2) dz, & \alpha^\mu = \beta_k^\mu \\ \int_{-\infty}^0 \varsigma(z | |\alpha^\mu| * \tilde{H}_{d,k}, \sigma^2) dz, & \alpha^\mu \neq \beta_k^\mu \end{cases}$$

By definitions as stated in equation (10) and equation (11), equation (15) becomes $$\Pr[\hat{X}_{d,k}^\mu = \beta_k^\mu | Z_{d,k}^\mu = \alpha^\mu * \tilde{H}_{d,k} + N_{d,k}^\mu] = \begin{cases} q^+(\tilde{H}_{d,k}, \sigma^2), & \alpha^\mu = \beta_k^\mu \\ q^-(\tilde{H}_{d,k}, \sigma^2), & \alpha^\mu \neq \beta_k^\mu \end{cases}.$$

Accordingly, $P_0$ can be expressed as:

$$P_0 = f(\alpha, \beta_k)|_{\alpha=\beta_k} \quad (16)$$
$$= Pr[\hat{X}_{d,k}^I = \beta_k^I | Z_{d,k}^I = \alpha^I * \tilde{H}_{d,k} + N_{d,k}^I]|_{\alpha=\beta_k} *$$
$$Pr[\hat{X}_{d,k}^Q = \beta_k^Q | Z_{d,k}^Q = \alpha^Q * \tilde{H}_{d,k} + N_{d,k}^Q]|_{\alpha=\beta_k}$$
$$= Pr[\hat{X}_{d,k}^I = \beta_k^I = \alpha^I \| Z_{d,k}^I = \alpha^I * \tilde{H}_{d,k} + N_{d,k}^I] *$$
$$Pr[\hat{X}_{d,k}^Q = \beta_k^Q = \alpha^Q | Z_{d,k}^Q = \alpha^Q * \tilde{H}_{d,k} + N_{d,k}^Q].$$

From (15), equation (16) can be simplified as follows:

$$P_0 = q^+(\tilde{H}_{d,k}, \sigma^2) * q^+(\tilde{H}_{d,k}, \sigma^2) = [q^+(\tilde{H}_{d,k}, \sigma^2)]^2. \quad (16\text{-}1)$$

Now, the expression of $P_0$ is obtained. Similarly, the expressions of $P_1$ and $P_2$ can be derived based on the aforementioned process, and thus a detailed description is deemed unnecessary. Eventually, the resulted $f(\alpha, \beta_k)$ can be concluded in equation (17) as follows:

$$\begin{cases} P_0 = [q^+(\tilde{H}_{d,k}, \sigma^2)] \\ P_1 = q^+(\tilde{H}_{d,k}, \sigma^2) \cdot q^-(\tilde{H}_{d,k}, \sigma^2) \\ P_2 = [q^-(\tilde{H}_{d,k}, \sigma^2)] \end{cases} \quad (17)$$

Next, taking equation (13) and equation (16-1) into equation (7), the final LLR for each coded bit can be formulated as follows:

$$LLR(b_m^\mu) =$$
$$\max_{\alpha \in S_{\mu,m}^{(1)}} \left\{ \frac{-1}{2\sigma^2} \cdot [(Z_{d,k}^I - \alpha^I \cdot \tilde{H}_{d,k})^2 + (Z_{d,k}^Q - \alpha^Q \cdot \tilde{H}_{d,k})^2] + \log f(\alpha, \beta_k) \right\} -$$
$$\max_{\alpha \in S_{\mu,m}^{(0)}} \left\{ \frac{-1}{2\sigma^2} \cdot [(Z_{d,k}^I - \alpha^I \cdot \tilde{H}_{d,k})^2 + (Z_{d,k}^Q - \alpha^Q \cdot \tilde{H}_{d,k})^2] + \log f(\alpha, \beta_k) \right\}.$$

Further deduction on the above equation can be achieved after referring to the IEEE paper "Simplified Soft-Output Demapper for Binary Interleaved COFDM with Application to HIPERLAN/2" proposed by Fillipo T. and Paola B. With this, we obtain the following:

$$LLR(b_m^\mu) = \max_{\alpha \in S_{\mu,m}^{(1)}} \left\{ \frac{-1}{2\sigma^2} * [(Z_{d,k}^I - \alpha^I * \tilde{H}_{d,k})^2 + \right. \quad (18)$$
$$\left. (Z_{d,k}^Q - \alpha^Q * \tilde{H}_{d,k})^2] + \log f(\alpha, \beta_k) \right\} -$$
$$\max_{\alpha \in S_{\mu,m}^{(0)}} \left\{ \frac{-1}{2\sigma^2} * [(Z_{d,k}^I - \alpha^I * \tilde{H}_{d,k})^2 + \right.$$
$$\left. (Z_{d,k}^Q - \alpha^Q * \tilde{H}_{d,k})^2] + \log f(\alpha, \beta_k) \right\}$$
$$= \max_{\alpha \in S_{\mu,m}^{(1)}} \left\{ \frac{-1}{2\sigma^2} * (Z_{d,k}^\mu - \alpha^\mu * \tilde{H}_{d,k})^2 + \log f(\alpha, \beta_k) \right\} -$$
$$\max_{\alpha \in S_{\mu,m}^{(0)}} \left\{ \frac{-1}{2\sigma^2} * (Z_{d,k}^\mu - \alpha^\mu * \tilde{H}_{d,k})^2 + \log f(\alpha, \beta_k) \right\}$$
$$= \frac{-1}{2\sigma^2} * \left\{ \max_{\alpha \in S_{\mu,m}^{(1)}} (Z_{d,k}^\mu - \alpha^\mu * \tilde{H}_{d,k})^2 - \right.$$
$$\left. \max_{\alpha \in S_{\mu,m}^{(0)}} ((Z_{d,k}^\mu - \alpha^\mu * \tilde{H}_{d,k})^2) \right\} + \xi(\beta_k^\mu)$$
$$= R_{b,m}^\mu + \xi(\beta_k^\mu),$$

where
$\xi(\beta_k^\mu) \equiv \text{sgn}(\beta_k^\mu) * G(\eta_k)$ and
$R_{b,m}^\mu \equiv$
$$\frac{-1}{2\sigma^2} * \left\{ \max_{\alpha \in S_{\mu,m}^{(1)}} (Z_{d,k}^\mu - \alpha^\mu * \tilde{H}_{d,k})^2 - \max_{\alpha \in S_{\mu,m}^{(0)}} ((Z_{d,k}^\mu - \alpha^\mu * \tilde{H}_{d,k})^2) \right\}$$

and for 4QAM modulation.

$$G(\eta_k) \equiv \log\left[\frac{q^+(|\tilde{H}_{d,k}, \sigma^2|)}{q^-(|\tilde{H}_{d,k}, \sigma^2|)}\right], \quad (19)$$

where $R_{b,m}^\mu$ is the legacy LLR without considering hard decision (HD) information provided by inner decoder as derived in the IEEE paper "Simplified Soft-Output Demapper for Binary Interleaved COFDM with Application to HIPERLAN/2" proposed by Filippo T. and Paola B. In contrast, the corrected LLR, $LLR(b_m^\mu)$, as shown in equation (18) is derived in this invention and is tuned as hard-decision-assisted LLR for convenience hereafter. Obviously, the sole difference between these two is merely the additive correction term $\xi(\beta_k^\mu)$. That is, in principle, hard-decision-assisted LLR as proposed in this invention can be obtained simply by adding the correction term $\xi(\beta_k^\mu)$ to the legacy LLR derived in the IEEE paper "Simplified Soft-Output Demapper for Binary Interleaved COFDM with Application to HIPERLAN/2" proposed by Filippo T. and Paola B. Accordingly, the overall decoding performance is improved as the hard decision (HD) information provided by inner decoder has been taken into account.

From equation (10) and equation (11), equation (19) equals to $$G(\eta_k) = \log\left\{\frac{1 - \frac{\sqrt{\pi}}{2} \cdot [2Q(\sqrt{\pi k}) - 1]}{1 + \frac{\sqrt{\pi}}{2} \cdot [2Q(\sqrt{\pi k}) - 1]}\right\},$$

where Q(.) is a Q-function.

The proposed approach in calculating LLR needed for LDPC decoding as shown in FIG. 7 can be applied to other scenarios with 4QAM modulation and any inner code concatenation with LDPC outer code to thereby increase the decoding performance.

Figure 10:
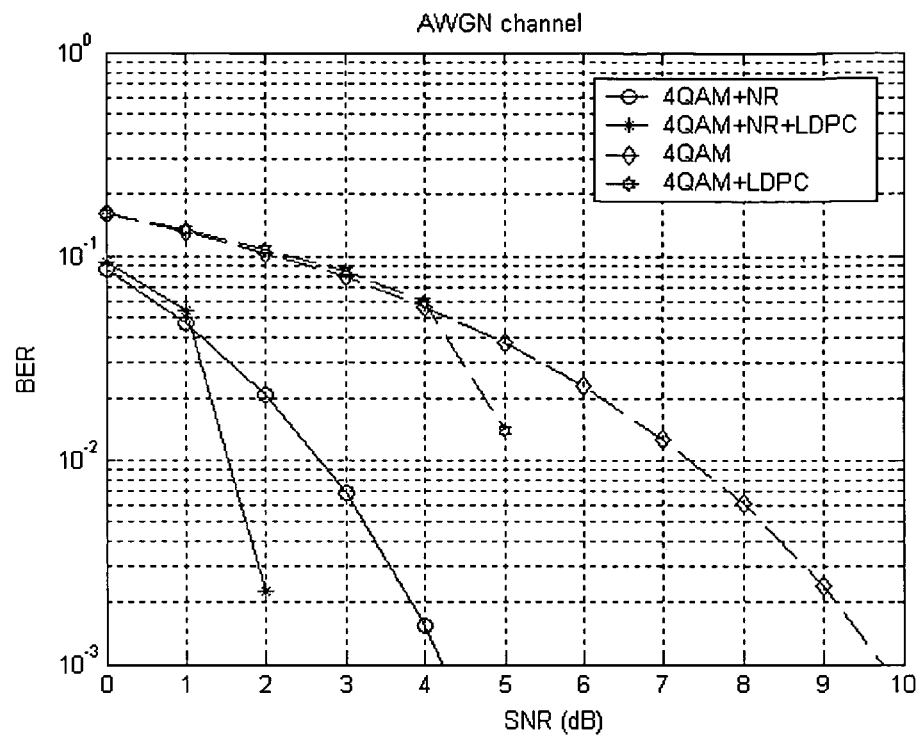
FIG. 10 is a graph of simulated performance at multicarrier mode under additive white Gaussian noise (AWGN) channel according to an embodiment of the invention.
Figure 11:
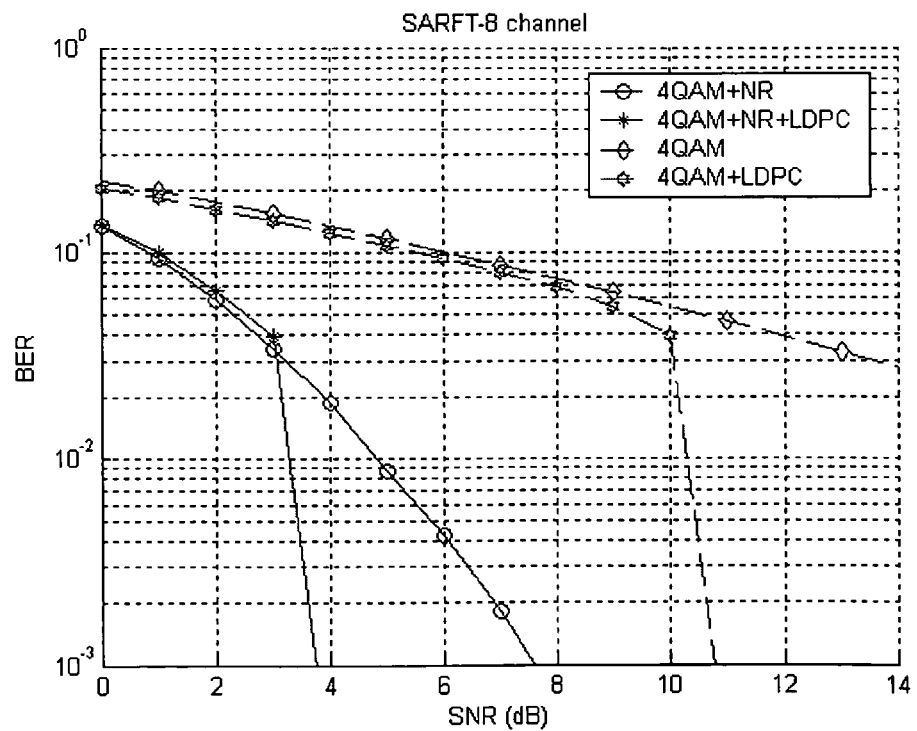
FIG. 11 is a graph of simulated performance at multicarrier mode under multi-path channel (SARFT-8) according to an embodiment of the invention.
Figure 12:
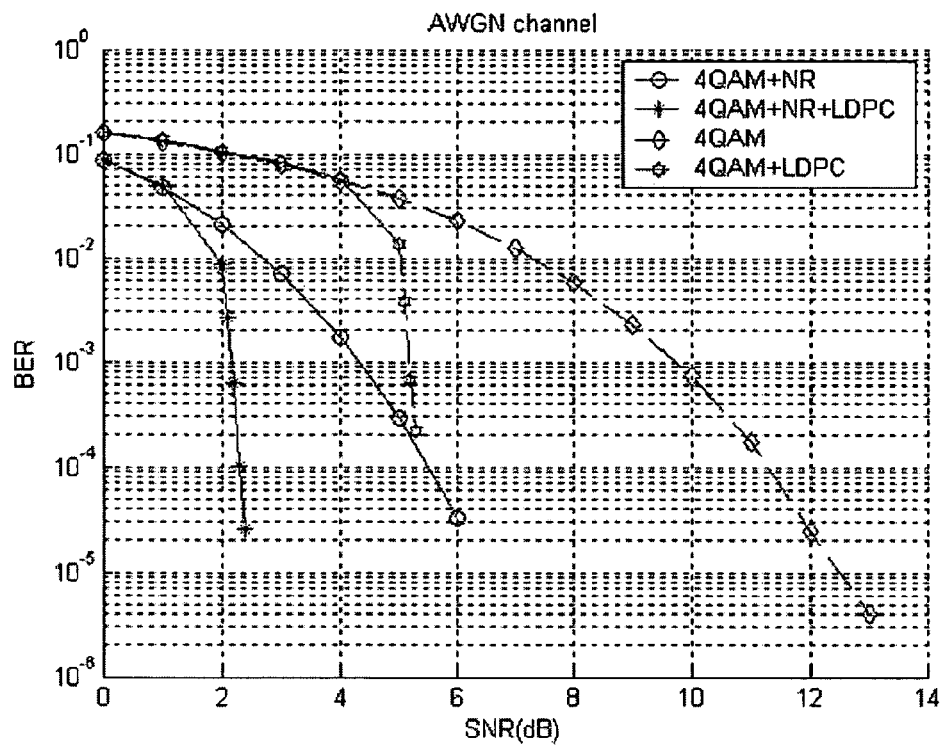
FIG. 12 is a graph of simulated performance at single carrier mode under additive white Gaussian noise (AWGN) channel according to an embodiment of the invention.
Figure 13:
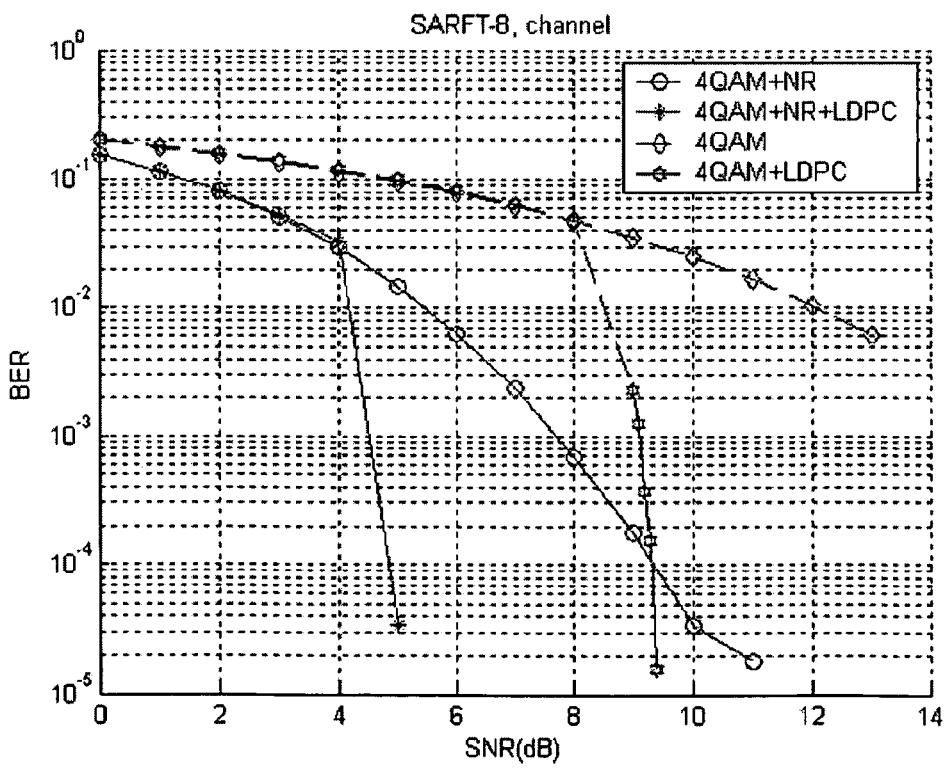
FIG. 13 is a graph of simulated performance at single carrier mode under multi-path channel (SARFT-8) according to an embodiment of the invention.

FIG. 10 and FIG. 12 show decoding performance at multicarrier and single carrier mode, respectively, under AWGN channel according to an embodiment of the invention. FIG. 11 and FIG. 13 show decoding performance at multicarrier and single carrier mode, respectively, under multipath channel according to an embodiment of the invention. In these figures, the horizontal axis indicate signal to noise power ratio (S/N or SNR) in dB, the vertical axis indicates bit error rate (BER), the multi-path channel under consideration is the SARFT-8 channel, and the LDPC code rate is 0.8 as specified by DTMB design specification. Also, to randomize possible bursty error, a frequency domain interleaver is assumed in the transmitter at multicarrier mode as suggested by the DTMB specification.

Each of these figures shows two pairs of BER performance curves at different BER conditions, one pair for 4QAM+NR indicated by the circles, which is briefly referred to as a 4QAM+NR curve, and for the combination of 4QAM+NR and LDPC indicated by the stars, which is briefly referred to as a 4QAM+NR+LDPC curve, and the other pair for 4QAM indicated by the diamonds, which is briefly referred to as a 4QAM curve, and for the combination of 4QAM and LDPC indicated by the polygon, which is briefly referred to as a 4QAM+LDPC curve. The 4QAM+NR curve and the 4QAM curve indicate the BER performance observed at input of LDPC decoder. They are obtained by means of equivalently computing the error rate by making hard decision (HD) (i.e. by taking sign value) on the soft information LLR($b_m^\mu$). The 4QAM+NR+LDPC curve and the 4QAM+LDPC curve indicate the BER performance curves observed at output of the LDPC decoder.

As to the example of the 4QAM+NR curve and the 4QAM+NR+LDPC curve, it is obviously seen in the figures that under the same SNR condition, the BER difference between the two curves is approximately as same as the coding gain obtained by introducing the NR coding. Namely, the LLR($b_m^\mu$) computation proposed by the invention uses the hard decision (HD) information produced by the NR decoder to thereby increase the coding gain effectively. In addition, since the LDPC codes themselves have the higher performance, the ends of the 4QAM-NR curve and the 4QAM-NR+LDPC curve in the figures fall steeply with increasing SNR.

As one of the key points of the invention is on "how to" utilize and jointly consider the hard-decided (HD) information provided by inner decoder (4QAM-NR is considered in our example but shall not be limited to this sole consideration) to improve performance of any LLR-based outer decoder (LDPC in our example; Turbo code is another example). As the HD information is obtained from inner decoder, they are more correct and less error prone as some of errors have been corrected (coding gain) during the inner decoding process. Thus, provision of this useful side information to LLR calculation makes the resulted LLR bring more information to outer decoder, leading to better overall decoding performance. In contract, calculating LLR without taken into account HD information leads to poorer performance corresponding to inner-code-free cases, due to ignorance of useful side information retrieved during the inner decoding process. The HD information is obtained by the so called minimum distance searcher 650 and is denoted by $\hat{X}_{d,k}$ in equation for LLR calculation. Theoretically speaking, the obtained LLR will be more informative for the followed LDPC decoding as more side information, $\hat{X}_{d,k}$, is taken into account. Taking sign of LLR is equivalent to conducting hard decision at the LDPC decoder input (i.e. 4QAM-NR decoder output). The resulted coding gains under AWGN and SARFT-8 channels have been shown in FIG. 10~FIG. 13. The overall coding gain at LDPC output is the sum of coding gain obtained from 4QAM-NR decoding and coding gain obtained from LDPC decoding. FIG. 10~FIG. 13 facilitate these conclusions in terms of coded BER at LDPC output. The proposed decoding scheme works equally well at either multi-carrier or single carrier mode.

From the definition of equation (5), LLR is the log likelihood ratio used to guess the true binary value of $b_m^\mu$ based on the available side information. The so called "likelihood ratio" is simply the ratio of probabilities corresponding to guessing $b_m^\mu=1$ and $b_m^\mu=0$, respectively, while conditioning on the available side information. From the definition, it is known that sign of LLR reveals which value of the corresponding bit shall be estimated. Amplitude of LLR, on the other hand, tells the reliability if the estimation is done in that way. Therefore, the goal is to make the amplitude of LLR larger while keeping the sign of LLR at the right value for better performance. This can actually be achieved by providing more useful side information from somewhere else in the system, e.g. from decision made from inner decoder.

In legacy LLR calculation, the available side information are merely $Z_{d,k}^\mu$ and $\tilde{H}_{d,k}^\mu$. In addition, the invention allows the provision of side information $\hat{X}_{d,k}$ provided by NR decoder to aid LLR calculation. When the prediction of $\hat{X}_{d,k}$ provided by inner decoder is good (true under high SNR), then provision of this additional side information will make the two conditional probabilities in likelihood ratio more distinguishable, leading to larger amplitude of the associated log likelihood ratio. Therefore, LLR will bring more information to LDPC decoder leading to better performance. When the prediction of $\hat{X}_{d,k}$ provided by inner decoder is poor (under low SNR), on the other hand, the value of $\hat{X}_{d,k}$ is uniformly distributed among all possible candidates (4 possible symbol values for 4QAM modulation). Under this circumstance, $\hat{X}_{d,k}$ provides no side information and thus the LLR value corresponding to each bit under test is almost not impacted, leading to equivalent performance for cases without $\hat{X}_{d,k}$ provision (thus degenerated to inner decoder free case). In other word, introduction of HD information to LLR calculation will not degrade final system performance for all circumstances in scenario under our consideration. Rather, additional coding gain (useful side information) provided by inner code improves system performance.

In view of the foregoing, it is known that the invention proposes a two-stage decoding system with which the NR decoder 430 performs a 4QAM-NR decoding to accordingly obtain hard decision information. And then, the soft symbols, the corresponding channel state information and the so obtained hard decision information are sent to the LLR computation device 460 for further computing an LLR. The LLR is sent to the LDPC decoder 470 for decoding. In addition, only an adder 780 is used to add the correction item $\xi(\hat{X}_{d,k}^\mu)$ in a non-hard-decision-assisted LLR $R_{b,m}^\mu$ computed by the LLR calculator 765. Accordingly, the useful information of hard-decision (HD) derived at inner decoder are successfully lumped optimally into LLR calculation needed for outer decoder. The other implication by this fact is that the derived LLR for 4QAM-NR can be degenerated easily to that for 4QAM simply by removing the additive correction term. This property is especially useful and convenient for system such as DTMB that adopts and expects to switch between these two modes.

In practice, further simplification is possible after taking into account the properties of outer decoder. For example, once the Min-sum algorithm is employed for LDPC decoding, the legacy LLR calculation device does not need noise power information.

Although the present invention has been explained in relation to its preferred embodiment, it is to be understood that many other possible modifications and variations can be made without departing from the spirit and scope of the invention as hereinafter claimed.

What is claimed is:

1. A decoding system for Low-density Parity-check codes (LDPC codes) concatenated with 4 Quadrature Amplitude Modulation Nordstrom-Robinson codes (4QAM-NR codes) in digital terrestrial multimedia broadcast (DTMB) system, comprising:

a channel estimator and equalizer, for receiving input signals $y_n$ to accordingly produce a plurality of estimation input signals $\overline{Y}_k$ and corresponding channel estimation signals $\hat{C}_k$;

a data partition device, connected to the channel estimator and equalizer, for performing a data partition on the estimation input signals $\overline{Y}_k$ and the corresponding channel estimation signals $\hat{C}_k$ to produce a plurality of partition estimation input signals $Z_{8\times1}$ and corresponding partition channel estimation signals $\tilde{H}_{8\times1}$;

an NR decoder, connected to the data partition device, for performing a decoding operation on the partition estimation input signals $Z_{8\times1}$ and the corresponding partition channel estimation signals $\tilde{H}_{8\times1}$ to produce a plurality of symbols $\hat{X}_{4\times1}$ $Z_{8\times1}$ and corresponding partial partition estimation input signals $Z_{4\times1}$ and corresponding partition channel estimation signals $\tilde{H}_{4\times1}$;

a time de-interleaver, connected to the NR decoder, for producing a plurality of time de-interleaved symbols $\hat{X}_{d,k}$ and corresponding time de-interleaved partition estimation input signals $Z_{d,k}$ and corresponding partition channel estimation signals $\tilde{H}_{d,k}$ based on the plurality of symbols $\hat{X}_{4\times1}$ and the corresponding partial partition estimation input signals $Z_{4\times1}$ and the corresponding partition channel estimation signals $\tilde{H}_{4\times1}$;

a noise power estimator, for estimating a noise power and producing a noise variance $\sigma^2$;

a log-likelihood ratio (LLR) computation device, connected to the noise power estimator and the time de-interleaver, for computing and producing an LLR based on the plurality of time de-interleaved symbols $\hat{X}_{d,k}$, the corresponding time de-interleaved partition estimation input signals $Z_{d,k}$, the corresponding partition channel estimation signals $\tilde{H}_{d,k}$ and the noise variance $\sigma^2$; and an LDPC decoder, connected to the LLR computation device, for producing a codeword based on the LLR;

wherein the channel estimator and equalizer comprises:

a channel estimator, for receiving the plurality of input signals $y_n$ and producing a plurality of estimation channel frequency responses (CFRs) $\hat{H}_k$ and a plurality of estimation channel impulse responses (CIRs) $\hat{h}_k$;

an equalizer, connected to the channel estimator, for producing a single-carrier input signal $Y_k^{SC}$ based on the plurality of input signals $y_n$ and the plurality of estimation CIRs $\hat{h}_k$;

a Fast Fourier Transform (FFT) device, for receiving the plurality of input signals $y_n$ to produce a plurality of estimation frequency input signals $Y_k$;

a phase rotation device, connected to the channel estimator and the FFT device, for producing the corresponding channel estimation signals $\hat{C}_k$ and a multi-carrier input signal $Y_k^{MC}$ based on the plurality of estimation CFRs $\hat{H}_k$ and the plurality of estimation frequency input signals $Y_k$; and a first multiplexer, connected to the equalizer and the phase rotation device, for selecting the single-carrier input signal $Y_k^{SC}$ or the multi-carrier input signal $Y_k^{MC}$ as the plurality of estimation input signals $\overline{Y}_k$ based on a single-carrier/multi-carrier signal.

2. The decoding system as claimed in claim 1, wherein the corresponding channel estimation signals $\hat{C}_k$ are expressed as:

$$\hat{C}_k = |\hat{H}_k|,$$

where $\hat{H}_k$ denotes the plurality of estimation CFRs, and the multi-carrier input signal $Y_k^{MC}$ is expressed as:

$$Y_k^{MC} = Y_k * e^{-j\angle \hat{H}_k},$$

where $Y_k$ denotes the plurality of estimation frequency input signals, and $\hat{H}_k$ denotes the estimation CFRs.

3. The decoding system as claimed in claim 1, wherein the NR decoder performs the decoding operation on the partition estimation input signals $Z_{8\times1}$ and the corresponding partition channel estimation signals $\tilde{H}_{8\times1}$ according to a minimum distance estimation.

4. The decoding system as claimed in claim 3, wherein the NR decoder comprises:

a second multiplexer, for selecting the partition channel estimation signals $\tilde{H}_{8\times1}$ or a unit of vectors $I_{8\times1}$ based on the single-carrier/multi-carrier signal to produce a temporary channel estimation signal $C_{8\times1}$;

a data block generator, for producing comparative data;

an NR encoder, connected to the data block generator, for performing an NR coding on the comparative data to produce an NR symbol;

a 4QAM mapper, connected to the NR encoder for mapping the NR symbol into a comparative symbol $\hat{X}_{8x}$; and a minimum distance searcher, connected to the data partition device, the second multiplexer and the 4QAM mapper, for producing a plurality of symbols $\hat{X}_{8\times1}$ based on the comparative symbol $\hat{X}_{8\times1}$, the temporary channel estimation signal $C_{8\times1}$ and the plurality of partition estimation input signals $Z_{8\times1}$.

5. The decoding system as claimed in claim 4, wherein the minimum distance searcher is based on an equation as follows to select and produce the plurality of symbols $\hat{X}_{8\times1}$:

$$\hat{X}_{8\times1} = \arg\min_{\hat{X}_{8\times1}} \sum_{i=1}^{8} \left| Z_{8\times1}^i - \hat{X}_{8\times1}^i \square C_{8\times1}^i \right|^2,$$

where i denotes a symbol index, $Z_{8\times1}^i$ denotes an i-th component of the plurality of partition estimation input signals $Z_{8\times1}$, $\hat{X}_{8\times1}^i$ denotes an i-th component of the comparative symbol $\hat{X}_{8\times1}$, and $C_{8\times1}^i$ denotes an i-th component of the temporary channel estimation signal $C_{8\times1}$.

6. The decoding system as claimed in claim 5, further comprising a data extractor, connected to the minimum distance searcher, the second multiplexer and the data partition device, for extracting data from the plurality of partition estimation input signals $Z_{8\times1}$, the temporary channel estimation signal $C_{8\times1}$ and the comparative symbol $\hat{X}_{8\times1}$ to produce the plurality of symbols $\hat{X}_{8\times1}$ and the corresponding partial partition estimation input signals $Z_{4\times1}$ and the corresponding partition channel estimation signals $\tilde{H}_{4\times1}$.

7. The decoding system as claimed in claim 1, wherein the LLR computation device comprises:
an inverse device, connected to the noise power estimator, for performing an inverse transformation on the noise variance $\sigma^2$ to produce the inverse $$\frac{1}{\sigma^2}$$

of the noise variance $\sigma^2$;
a square device, connected to the time de-interleaver, for performing a square operation on the corresponding time de-interleaved partition channel estimation signals $\tilde{H}_{d,k}$ of the time de-interleaver to produce a square $(\tilde{H}_{d,k})^2$ of the corresponding time de-interleaved partition channel estimation signals $\tilde{H}_{d,k}$;
a first multiplier, connected to the inverse device and the square device, for multiplying the inverse $$\frac{1}{\sigma^2}$$

by the square $(\tilde{H}_{d,k})^2$ to produce a product $\eta_k = (\tilde{H}_{d,k})^2 / \sigma^2$;
a plurality of function generators, connected to the first multiplier, for producing a predetermined value based on the product $\eta_k$;
a range decider, connected to the first multiplier, for producing a select signal based on the product $\eta_k$;
a component selector, connected to the time de-interleaver, for selecting real or imaginary components of the plurality of time de-interleaved symbols $\hat{X}_{d,k}$ to produce a component output $\hat{X}_{d,k}^\mu$;)
a sign device, connected to the component selector, for determining a sign of the component output $\hat{X}_{d,k}^\mu$ based on a function of $\text{sgn}(\bullet)$;
a selector, connected to the plurality of function generators and the range decider, for selecting one as an output $G(\theta_k)$ from the outputs of the plurality of function generators based on the select signal;
a second multiplier, connected to the sign device and the selector in order to multiply the output $G(\theta_k)$ by the component output $\hat{X}_{d,k}^\mu$ to produce a correction item $\xi(\hat{X}_{d,k}^\mu)$;
an LLR calculator, connected to the time de-interleaver and the inverse device for producing a non-hard-decision-assisted LLR $R_{b,m}^\mu$ on the inverse $$\frac{1}{\sigma^2},$$

the plurality of time de-interleaved symbols $\hat{X}_{d,k}$, the corresponding time de-interleaved partition estimation input signals $Z_{d,k}$ and the corresponding time de-interleaved partition channel estimation signals $\tilde{H}_{d,k}$; and an adder, connected to the second multiplier and the LLR calculator for adding the correction item $\xi(\hat{X}_{d,k}^\mu)$ in the non-hard-decision-assisted LLR $R_{b,m}^\mu$ to produce the LLR.

8. The decoding system as claimed in claim 7, wherein the LLR $\text{LLR}(b_m^\mu)$ is expressed as:

$$LLR(b_m^\mu) = \log\frac{Pr[b_m^\mu = 1 \mid Z_{d,k}^\mu, \tilde{H}_{d,k}, \hat{X}_{d,k}]}{Pr[b_m^\mu = 0 \mid Z_{d,k}^\mu, \tilde{H}_{d,k}, \hat{X}_{d,k}]} = R_{b,m}^\mu + \xi(\hat{X}_{d,k}^\mu),$$

where $\xi(\hat{X}_{d,k}^\mu)$ denotes the correction item, and $R_{b,m}^\mu$ denotes the non-hard-decision-assisted LLR which is expressed as:

$$, R_{b,m}^\mu = \frac{1}{2\sigma^2}\left\{\min_{a\in S_{\mu,m}^{(1)}}(Z_{d,k}^\mu - a^\mu * \tilde{H}_{d,k})^2 - \min_{a\in S_{\mu,m}^{(0)}}(Z_{d,k}^\mu - a^\mu * \tilde{H}_{d,k})^2\right\}$$

where $S_{\mu,m}^{(1)}$, $S_{\mu,m}^{(0)}$ indicate a set of partition constellation points.

9. The decoding system as claimed in claim 8, wherein the correction item $\xi(\hat{X}_{d,k}^\mu)$ is expressed as:

$$\xi(\hat{X}_{d,k}^\mu) = \text{sgn}(\hat{X}_{d,k}^\mu) * G(\theta_k),$$

where $\text{sgn}(\bullet)$ denotes a sign function, $$G(\eta_k) = \log\left\{\frac{1 - \frac{\sqrt{\pi}}{2}[2Q(\sqrt{\eta_k}) - 1]}{1 + \frac{\sqrt{\pi}}{2}[2Q(\sqrt{\eta_k}) - 1]}\right\},$$

$$\eta_k = (\tilde{H}_{d,k})^2/\sigma^2, \text{ and } Q(x) = \frac{1}{\sqrt{2\pi}}\int_x^\infty e^{-t^2/2}\,dt.$$

10. A decoding system for Low-density Parity-check codes (LDPC codes) concatenated with 4 Quadrature Amplitude Modulation Nordstrom-Robinson codes (4QAM-NR codes) in digital terrestrial multimedia broadcast (DTMB) system, comprising:
a channel estimator and equalizer, for receiving input signals $y_n$ to accordingly produce a plurality of estimation input signals $Y_k$ and corresponding channel estimation signals $\hat{C}_k$;
a data partition device, connected to the channel estimator and equalizer, for performing a data partition on the estimation input signals $Y_k$ and the corresponding channel estimation signals $\hat{C}_k$ to produce a plurality of partition estimation input signals $Z_{8\times1}$ and corresponding partition channel estimation signals $\tilde{H}_{8\times1}$;
an NR decoder, connected to the data partition device, for performing a decoding operation on the plurality of partition estimation input signals $Z_{8\times1}$ and the corresponding partition channel estimation signals $\tilde{H}_{8\times1}$ to produce a plurality of symbols $\hat{X}_{4\times1}$ and corresponding partial partition estimation input signals $Z_{4\times1}$ and corresponding partition channel estimation signals $\tilde{H}_{4\times1}$;
a time de-interleaver, connected to the NR decoder, for producing a plurality of time de-interleaved symbols $\hat{X}_{d,k}$ and corresponding time de-interleaved partition estimation input signals $Z_{d,k}$ and corresponding partition channel estimation signals $\tilde{H}_{d,k}$ based on the plurality of symbols $\hat{X}_{4\times1}$ and the corresponding partial partition estimation input signals $Z_{4\times1}$ and the corresponding partition channel estimation signals $\tilde{H}_{4\times1}$;

a noise power estimator, for estimating a noise power and producing a noise variance $\sigma^{2R_b,m}{}^{\mu}$;

a log-likelihood ratio (LLR) computation device, connected to the noise power estimator and the time de-interleaver, for computing and producing an LLR based on the plurality of time de-interleaved symbols $\hat{X}_{d,k}$, the corresponding time de-interleaved partition estimation input signals $Z_{d,k}$, the corresponding partition channel estimation signals $\tilde{H}_{d,k}$ and the noise variance $\sigma^2$; and an LDPC decoder, connected to the LLR computation device, for producing a codeword based on the LLR;

wherein the NR decoder performs the decoding operation on the plurality of partition estimation input signals $Z_{8\times1}$ and the corresponding partition channel estimation signals $\tilde{H}_{8\times1}$ according to a minimum distance estimation, and the NR decoder comprises:

a second multiplexer, for selecting the partition channel estimation signals $\tilde{H}_{8\times1}$ or a unit of vectors $I_{8\times1}$ based on a single-carrier/multi-carrier signal to produce a temporary channel estimation signal $C_{8\times1}$;

a data block generator, for producing comparative data;

an NR encoder, connected to the data block generator, for performing an NR coding on the comparative data to produce an NR symbol;

a 4QAM mapper, connected to the NR encoder for mapping the NR symbol into a comparative symbol $\hat{X}_{8\times1}$; and a minimum distance searcher, connected to the data partition device, the second multiplexer and the 4QAM mapper, for producing a plurality of symbols $\hat{X}_{8\times1}$ based on the comparative symbol $\hat{X}_{8\times1}$ the temporary channel estimation signal $C_{8\times1}$ and the plurality of partition estimation input signals $Z_{8\times1}$.

* * * * *